United States Patent
Oberst et al.

(10) Patent No.: US 8,670,520 B2
(45) Date of Patent: Mar. 11, 2014

(54) SHIFT REGISTER AND ONE-OF-MANY SHIFT REGISTER

(71) Applicant: Fraunhofer-Gesellschaft zur Foerderung der angewandten Forschung e.V., Munich (DE)

(72) Inventors: Matthias Oberst, Nuremberg (DE); Johann Hauer, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 13/968,576

(22) Filed: Aug. 16, 2013

(65) Prior Publication Data
US 2013/0329850 A1    Dec. 12, 2013

Related U.S. Application Data

(63) Continuation of application No. PCT/EP2012/052509, filed on Feb. 14, 2012.

(30) Foreign Application Priority Data

Feb. 17, 2011  (DE) .......................... 10 2011 004 310

(51) Int. Cl.
*G11C 19/00* (2006.01)
*H03K 3/289* (2006.01)
*H03K 3/356* (2006.01)

(52) U.S. Cl.
USPC ............. 377/75; 327/202; 327/203; 327/208; 327/218

(58) Field of Classification Search
None
See application file for complete search history.

(56) References Cited

U.S. PATENT DOCUMENTS 5,280,203 A * 1/1994 Hung et al. ...................... 326/37
5,767,718 A * 6/1998 Shih ............................... 327/228

(Continued)

OTHER PUBLICATIONS

English translation of Official Communication issued in corresponding International Application PCT/EP2012/052509, mailed on Aug. 22, 2013.

(Continued)

*Primary Examiner* — Tuan T Lam
(74) *Attorney, Agent, or Firm* — Keating & Bennett, LLP

(57) ABSTRACT

A shift register has a first latch and a second latch and a first output circuit and a second output circuit. The first latch and the second latch are series-connected. The latches are implemented to take over a signal state applied to their data inputs in a transparent state and to maintain the taken-over signal state in a non-transparent operating state. Clock inputs of the latches are switched such that the second latch is in the transparent operating state when the first latch is in the non-transparent operating state and vice versa. The first output circuit is implemented to provide a predetermined level independent of the signal state existing in the first latch at a first shift register output of the shift register in the transparent operating state and to provide a level depending on the signal state stored in the first latch in the non-transparent operating state of the first latch. The second output circuit is implemented to provide a predetermined level independent of the signal state existing in the second latch at a second shift register output of the shift register in the transparent operating state of the second latch and to provide a level depending on the signal state stored in the second latch in the non-transparent operating state of the second latch.

19 Claims, 6 Drawing Sheets

(56) References Cited

U.S. PATENT DOCUMENTS

| | | | |
|---|---|---|---|
| 7,248,090 B2 * | 7/2007 | Ramprasad | 327/202 |
| 7,301,381 B2 * | 11/2007 | Rhee et al. | 327/203 |
| 7,773,718 B2 * | 8/2010 | Cheng et al. | 377/64 |
| 8,471,618 B2 * | 6/2013 | Chien et al. | 327/208 |
| 2001/0017561 A1 * | 8/2001 | Nakaizumi | 327/202 |
| 2002/0047736 A1 * | 4/2002 | Raychaudhuri | 327/202 |
| 2005/0229059 A1 | 10/2005 | Hirano | |
| 2011/0084748 A1 * | 4/2011 | Firmin et al. | 327/203 |

OTHER PUBLICATIONS

Official Communication issued in International Patent Application No. PCT/EP2012/052509, mailed on Mar. 27, 2012.

* cited by examiner ion No. PCT/EP2012/052509, filed Feb. 14,
SHIFT REGISTER AND ONE-OF-MANY SHIFT REGISTER

CROSS-REFERENCE TO RELATED APPLICATIONS

This application is a continuation of copending International Applicati
2012, which is incorporated herein by reference in its entirety, and additionally claims priority from German Application No. DE 102011004310.1, filed Feb. 17, 2011, which is also incorporated herein by reference in its entirety.

BACKGROUND OF THE INVENTION

Embodiments of the present invention provide a shift register as it may, for example, be used in one-of-many shift registers. Further embodiments provide a one-of-many shift register as it may, for example, be used in image sensors or generally in multiplexers.

With a one-of-many selection circuit, exactly one output of a number N of outputs has a digital level of "1". All other outputs have a level of "0". For the realization, a shift register is used through which a "1" is shifted.

The setup of such a conventional shift register (SR) is illustrated in FIG. 4.

The flip-flops 401a to 401n are connected to each other such that all D flip-flops 401a to 401n receive the same clock signal 403 (or at least the same clock levels and clock edges). The output of one D flip-flop is connected to the input of the next D flip-flop.

The D flip-flops illustrated in FIG. 4 may here be set up as illustrated in FIG. 5.

In FIG. 5, in addition two inverters 501, 503 for clock inversion and clock conditioning are introduced which are contained in many standard cells.

The inverter 501 at the input of the D flip-flop 401a is responsible for refreshing an input signal 505 and the inverter 503 at the output of the D flip-flop 401a is responsible for driving the output load. In between, two latches 507, 509 are located (latch memory member), which have an inverted clock control.

A first latch 507 takes over the data at the input when an input switch 511 of the first latch 507 is closed (conductive). In FIG. 5, the first latch 507 takes over the input data, when CKD is "0" and CKN is "1", i.e. when CK="0" (with a low level of the clock signal 403). A feedback switch 513 of the first latch 507 is then opened (not conductive) and inverters 515, 517 of the first latch 507 take on a state which depends on the input signal 505. While CK="0", any change of the input signal 505 causes a change of the inverter outputs of the two inverters 515, 517 of the first latch 507. One says that the latch is transparent. At the rising edge of CK (the clock signal 403), the input switch 511 of the first latch 507 opens and the feedback switch 513 of the first latch 507 closes. Here, the preceding input value is stored in the feedback inverters 515, 517. The first latch 507 is no longer transparent.

Due to the series connection of the invertedly clocked latches 507, 509, one latch is transparent, while the other latch latches. While CK="0", the input (the signal state of the input signal 505 at the input) in the first latch 507 is taken over transparently. The second latch 509 meanwhile maintains the old output value. When CK rises to "1", the first latch 507 stores the preceding input value and forwards the same to the second latch 509. The second latch 509 is now transparent, but the output does not change as the input does not change (as the first latch 507 is in the non-transparent state). The input is forwarded to the output. Thus, the D flip-flop 401a takes over the input with a rising clock edge to the output. Between the clock edges, the input signal 505 may change without the output changing.

In the shift register illustrated in FIG. 4, it is assumed in the output state that all D flip-flops 401a to 401n have "0" at the input and output and that the clock level is "0". If "1" is applied to the input of the shift register (at a data input of the first D flip-flop 401a) and a rising edge is applied to the clock, this "1" is taken over into the first D flip-flop 401a, all other D flip-flops 401b to 401n take over the inputs to the outputs, according to the initial value "0". Then, a "0" is applied to the input of the shift register and a further clock period is generated. The "0" at the input is taken over into the first D flip-flop 401a, while the second D flip-flop 401b takes over the "1" of the first D flip-flop 401a. All other D flip-flops again take over "0". With every further rising clock edge (of the clock signal 402), the "1" is shifted on by one D flip-flop.

This circuit may be used to select one of N. For this purpose, N DFFs are needed.

The number of transistors needed to implement the function is N*24, as a DFF contains 24 transistors. It is a precondition here that a switch and an inverter are each set up from two transistors.

There is the possibility of using dynamic DFFs. The same have the disadvantage, however, that they operate error-free only from a minimum clock frequency. For each output of the shift register, thus a D flip-flop is needed. As conventional D flip-flop implementations (as are illustrated, for example, in FIG. 5) need 24 transistors, for such a shift register a large number of transistors and thus a large area for the shift register is needed.

SUMMARY

According to an embodiment, a one-of-many selection circuit may have a one-of-many shift register which may have a data input and a clock input, wherein the one-of-many shift register may have a plurality of series-connected shift registers which may have a first latch which is implemented to take over a signal state applied to its data input in a transparent operating state and to maintain the taken-over signal state in a non-transparent operating state; a second latch which is implemented to take over a signal state applied to its data input in a transparent operating state and to maintain the taken-over signal state in a non-transparent operating state; wherein the first latch and the second latch are series-connected; wherein clock inputs of the latches are switched such that the second latch is in the transparent operating state when the first latch is in the non-transparent operating state and vice versa; a first output circuit which is implemented to provide a predetermined level independent of the signal state existing in the first latch at a first shift register output of the shift register in the transparent operating state of the first latch and to provide a level depending on the signal state stored in the first latch in the non-transparent operating state of the first latch; and a second output circuit which is implemented to provide a predetermined level independent of the signal state existing in the second latch at a second shift register output of the shift register in the transparent operating state of the second latch and to provide a level depending on the signal state stored in the second latch in the non-transparent operating state of the second latch; wherein the shift registers are coupled to the data input and the clock input such that a "1" applied to the data input is shifted through the shift registers such that with a falling clock edge at the clock input the "1" is shifted on from a first shift register output of a first shift register of the plurality of shift registers to a second shift register output of the same shift register and that with a rising clock edge the "1" is shifted on from the second shift register output of the first shift register to a first shift register output of a subsequent shift register; or that with a rising clock edge at the clock input the "1" is shifted on from a first shift register output of a first shift register of the plurality of shift registers to a second shift register output of the same shift register and that with a falling clock edge the "1" is shifted on from the second shift register output of the first shift register to a first shift register output of a subsequent shift register.

According to another embodiment, an image sensor may have a one-of-many selection circuit as mentioned above.

According to another embodiment, a multiplexer may have a one-of-many selection circuit as mentioned above.

Embodiments of the present invention provide a shift register with a first latch, a second latch, a first output circuit and a second output circuit.

The first latch is implemented, in a transparent operating state, to take over a signal state applied to its input and, in a non-transparent operating state, to maintain the taken-over signal state. The second latch is implemented, in a transparent operating state, to take over a signal state applied to its input and, in a non-transparent operating state, to maintain the taken-over signal state.

The first latch and the second latch are connected in series. An input level at the second latch may thus be based on an output level at the first latch.

Clock inputs of the two latches are switched such that the second latch is in the transparent operating state when the first latch is in the non-transparent operating state, and that the first latch is in the transparent operating state when the second latch is in the non-transparent operating state. For example, the clock inputs of the two latches may be controlled invertedly with respect to each other.

The first output circuit is implemented to provide a predetermined level independent of the signal state existing in the first latch at a first shift register output of the shift register in the transparent operating state of the first latch and to provide a level (for example identical to the signal state stored in the first latch or inverted to the same) depending on the signal state stored in the first latch in the non-transparent operating state of the first latch.

The second output circuit is implemented to provide a predetermined level independent of the signal state existing in the second latch at a second shift register output of the shift register in the transparent operating state of the second latch and to provide a level (for example identical to the signal state stored in the second latch or inverted to the same) depending on the signal state stored in the second latch in the non-transparent operating state of the second latch.

It is the central idea of the present invention that a more space-efficient shift register (which, for example, needs a smaller number of transistors) may be provided if the typical latches used in a D flip-flop are used to control two "subsequent" or neighboring (in the sense of a shift of the input value) shift register outputs. It was found that a clock edge controlled performance of the shift register may be acquired when the level at the first shift register output depends on the signal state stored in the first latch only in the non-transparent operating mode of the first latch and in the transparent operating mode of the first latch a predetermined level is applied to the first shift register output. It may thus be acquired, as with a D flip-flop, that the output does not change although the input changes. This applies analogously for the second shift register output and the second latch. Due to the wiring of the clock inputs of the two latches so that, when the first latch is in the non-transparent operating mode the second latch is in the transparent operating mode and vice versa, and due to the correspondingly controlled output circuits, it is acquired that one (apart from changeover or switching times) of the shift register outputs has a level which depends on a signal state stored in its associated latch, while the other shift register output has a fixed predetermined level.

It was further found that, by using the two (controlled clockwise invertedly with respect to each other) series-connected latches, it may be acquired that the output or a value to be output is shifted on from one shift register output to a next shift register output at each clock edge (i.e. with a falling and rising clock edge) (and not, as is illustrated in the conventional shift register illustrated in FIG. 4, only with every second clock edge).

In other words, with the inventive shift register there is at least one output per latch, wherein corresponding output circuits are provided. Thus, an input value occurs (for example a "1" which is preceded by at least one "0" and followed by at least one "0") within a period of the clock signal at two shift register outputs, i.e., for example, in a first phase of the clock signal (e.g. "1"—state of the clock signal) at the first shift register output and in a second phase of the clock signal (e.g. "0"—state of the clock signal) at the second shift register output.

It may thus be acquired that the clock frequency for controlling the shift register may be halved, but a "1" applied to the input of the shift register (at the input of the first latch) is shifted on just as fast as with the conventional shift register illustrated in FIG. 4.

It is an advantage of embodiments of the present invention that a shift register with clearly reduced switching complexity may be provided which additionally enables halving the clock frequency without reducing the shifting speed. Due to the possible reduction of the clock frequency, interferences of other circuit parts on the same integrated circuitry may be reduced and, further, the current consumption of the shift register may be decreased as compared to conventional shift registers. The shift register is well suited for sequences of logic values, wherein isolated "1" values and isolated "0" values occur.

Thus, embodiments enable a more space-efficient and current-efficient shift register.

According to embodiments, the clock inputs of the two latches may be switched invertedly such that, when at the clock input of the first latch a first level is applied (for example a digital high level or a logical "1"), at the clock input of the second latch a level complementary to the first level is applied (for example a digital low level or a logical "0"). Thus, for example, the clock input of the first latch may be coupled to a clock input of the shift register such that the level at the clock input of the first latch is equal to the level at the clock input of the shift register and the clock input of the second latch may be coupled to the clock input of the shift register such that the level at the clock input of the second latch is inverted to the level at the clock input of the shift register. The two latches may, for example, be clock-state controlled latches, i.e. they are either in the transparent operating mode or the non-transparent operating mode depending on the level of the clock signal applied to their clock input. For example, a high level or a "1" at the clock input of the latches may lead to the fact that the latches are in their non-transparent operating state and a low level or a "0" may lead to the fact that the latches are in their transparent operating state or vice versa. The two latches may thus comprise an identical internal clock control for controlling the operating states of the latches.

In the present application, a coupling of two terminals may be a direct coupling and an indirect coupling to one or several interconnected members so that a signal at a second circuit node (or at a second terminal) depends on a signal at a first circuit node (or at a first terminal) coupled to the second circuit node. In other words, between the two terminals coupled to each other, further members, in particular passive members, like, for example, resistors or switching paths of active members, like, for example, of switches or transistors or also inverters, may be connected. With terminals coupled to each other, a member may be connected between those terminals or not, so that two coupled terminals may also be directly connected to each other (i.e. by a low-impedance conductive connection).

Further, according to the present application, a first terminal is directly connected to a second terminal if a signal applied to the second terminal is identical to a signal applied to the first terminal, wherein parasitic effects or slight losses due to conductor resistances or delays due to additional buffer elements are not considered. Two directly connected terminals are thus typically connected via conductive traces or wires without additional interconnected members.

According to further embodiments, however, the same clock signal may be applied to the first latch and the second latch, wherein the internal clock control of the latches is different, however, so that, for example, a high level at the clock input of the first latch leads to the fact that the first latch is in the non-transparent operating state while a high level at the clock input of the second latch leads to the fact that the second latch is in the transparent operating state. A low level at the clock input of the first latch then leads to the fact that the first latch is in the transparent operating state and a low level at the clock input of the second latch leads to the fact that the second latch is in the non-transparent operating state or vice versa.

According to further embodiments, also the output circuits may comprise clock inputs, wherein the clock inputs of the output circuits may be switched invertedly, such that when a first level is applied to the clock input of the first output circuit, a level which is complementary to the first level is applied to the clock input of the second output circuit.

BRIEF DESCRIPTION OF THE DRAWINGS

Embodiments of the present invention will be detailed subsequently referring to the appended drawings, in which:

FIG. 2b is a time-state diagram of states of different signal nodes of the shift register illustrated in FIG. 2a;

DETAILED DESCRIPTION OF THE INVENTION

Figure 1:
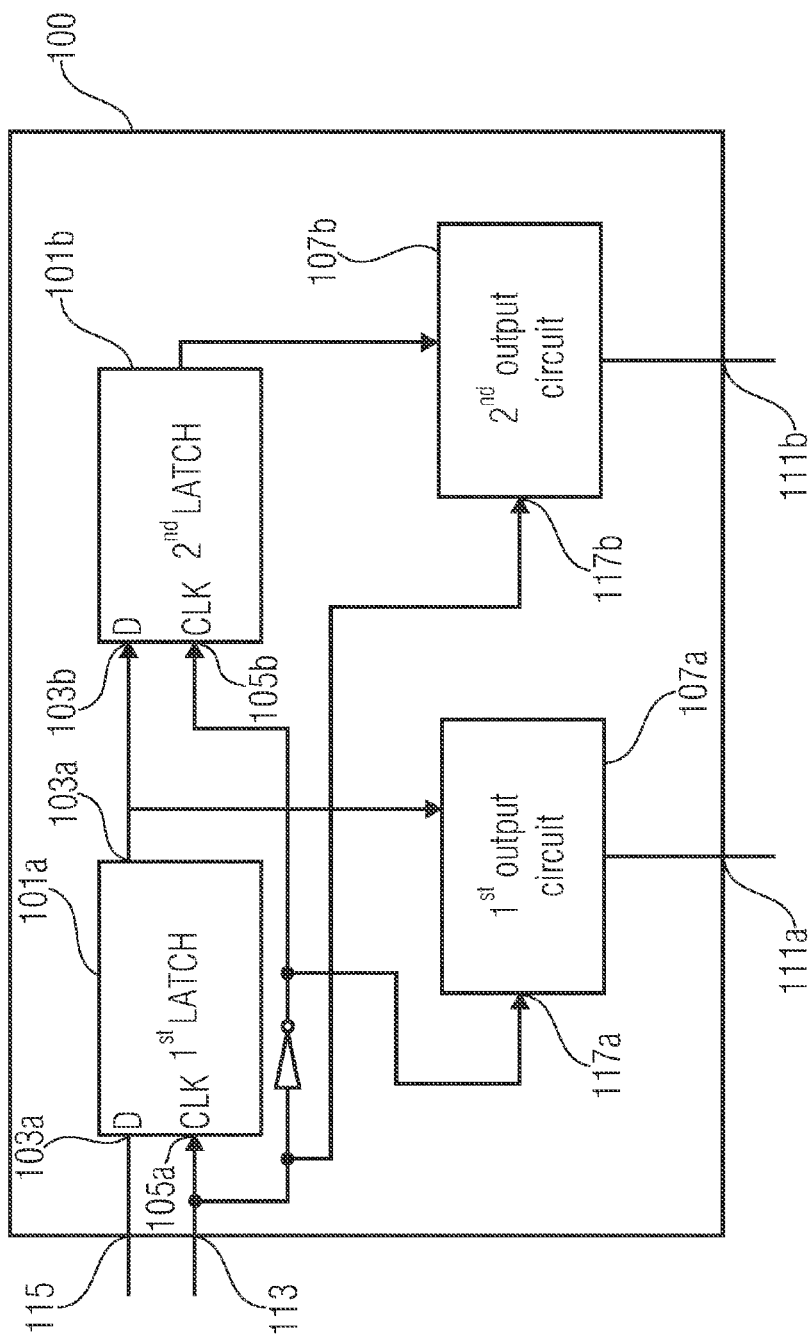
FIG. 1 is a block diagram of a shift register according to one embodiment.

Before embodiments of the present invention are described in detail in the following, it is to be noted that like elements or elements of the same function are provided with the same reference numerals and that a repeated description of those elements is omitted. The descriptions of elements having the same reference numerals is thus mutually interchangeable.

FIG. 1 shows a block diagram of a shift register 100 according to one embodiment.

The shift register 100 comprises a first latch 101a with a data input 103a and a clock input 105a. Further, the shift register 100 comprises a second latch 101b with a data input 103b and a clock input 105b. Further, the shift register 100 comprises a first output circuit 107a and a second output circuit 107b.

The first latch 101a is implemented to take over a signal state applied to its data input 103a in a transparent operating state and to maintain the taken-over signal state in a non-transparent operating state.

The second latch 101b is implemented to take over a signal state applied to its data input 103b in a transparent operating state and to maintain the taken-over signal state in a non-transparent operating state.

The first latch 101a and the second latch 101b are connected in series, for example such that a level at the data input 103b of the second latch 101b is based on a level at an output 109a of the first latch 101a.

The clock inputs 105a, 105b of the latches 101a, 101b are switched such that the second latch 101b is in the transparent operating state when the first latch 101a is in the non-transparent operating state and vice versa, i.e. that the second latch 101b is in the non-transparent operating state when the first latch 101a is in the transparent operating state.

The first output circuit 107a is implemented to provide a predetermined level independent of the signal state existing in the first latch 101a at a first shift register output 111a of the shift register 100 in the transparent operating state of the first latch 101a and to provide a level depending on the signal state stored in the first latch 101a in the non-transparent operating state of the first latch 101a.

The second output circuit 107b is implemented to provide a predetermined level independent of the signal state existing in the second latch 101b at a second shift register output 111b of the shift register 100 in the transparent operating state of the second latch 101b and to provide a level depending on the signal state stored in the second latch 101b in the non-transparent operating state of the second latch 101b.

The clock input 105a of the first latch 101a may be coupled (for example directly connected or by means of two series-connected inverters) to a clock input 113 of the shift register 100, for example such that a level at the clock input 105a of the first latch 101a is equal to a level at the clock input 113 of the shift register 100.

The clock input 105b of the second latch 101b may be coupled (for example by means of an inverter) to a clock input 113 of the shift register 100, for example such that a level at the clock input 105b of the second latch 101b is complementary to a level at the clock input 113 of the shift register 100 (and to the level at the clock input 105a of the first latch 101a).

Further, the data input 103a may be coupled to a data input 115 of the shift register 100 (for example directly connected), for example such that a level at the data input 103a of the first latch 101a is a level at the data input 115 of the shift register 100.

In the following, the functioning of the shift register 100 illustrated in FIG. 1 is to be explained. It is assumed here that the latches 101a and 101b with a low level at their clock inputs 105a, 105b are in the non-transparent operating state and with a high level at their clock inputs 105a, 105b are in the transparent operating state.

Based on a state in which a level of the signal state existing in the first latch 101a is "0" and a level of the signal state existing in the second latch 101b is "0", a "1" is applied to the data input 115 of the shift register 100. This "1" is taken over into the first latch 101a in the next transparent operating state of the first latch 101a (i.e. with the next level of "0" at the clock input 105a of the first latch 101a). In the transparent state of the first latch 101a, the first output circuit 107a provides a predetermined level (for example level of "0") at the first shift register output 111a. Further, the second latch 101b is in the non-transparent state, so that the second output circuit 107b at the second shift register output 111b provides a level depending on the signal state stored in the second latch 101b (for example level of "0", as the signal state stored in the second latch 101b has a level of "0").

With the next level of "1" at the clock input 113 of the shift register 100, the first latch 101a switches into the non-transparent operating mode and maintains the taken-over signal state (the "1" taken-over from the data input 103a). Further, the first output circuit 107a provides a level at the first shift register output 111a depending on the signal state stored in the first latch 101a (for example level of "1", as the signal state stored in the first latch 101a has a level of "1"). Further, the second latch 101b switches into the transparent state and takes over the signal state applied to its data input 103b (which is based on the signal state in the first latch 101a due to the series connection of the two latches 101a, 101b and is, for example, identical to the same, i.e. has a level of "1", for example). Further, the second output circuit 107b provides the predetermined level (for example level of "1") at the second shift register output 111b.

With shift registers, the level of "1" at the data input 115 is typically only available for one clock cycle (for example from a rising edge up to the next rising edge). I.e., with the next level of "0" of the clock signal at the clock signal input 113 of the shift register 100, the data input 115 is already reset (to the level of "0"). The second latch 101b switches into the non-transparent operating state and maintains the signal state (i.e. the level of "1") taken over from its data input 103b. The second output circuit 107b provides a level at the second shift register output 111b depending on the signal state stored in the second latch 101b (for example the level of "1", as the signal state stored in the second latch 101b has the level of "1").

Further, the first latch 101a switches into the transparent operating state and takes over the signal state applied to its data input 103a. The first output circuit 107a provides the predetermined level which is independent of the signal state in the first latch 101a at the first shift register output 111a.

By the concept illustrated in FIG. 1, a clock edge controlled shift register is enabled which shifts onwards a "1" twice in one clock cycle (or one clock period at the clock input 113) at its data input 115.

With a conventional shift register two D flip-flops (with two latches each) would have to be used to acquire the functionality illustrated in FIG. 1 and the same would have to be clocked twice as fast as is the case with the concept illustrated in FIG. 1. Embodiments of the present invention thus enable a more space-efficient and more current-efficient shift register.

As is illustrated in FIG. 1, the output circuit 107a may further comprise a clock input 117a and the second output circuit 107b may comprise a clock input 117b. The clock inputs 117a, 117b of the output circuits 107a, 107b may be switched invertedly such that, when at the clock input 117a of the first output circuit 107a a first level is applied (for example a level of "1"), at the clock input 117b of the second output circuit 107b a level is applied which is complementary to the level at the clock input 117a (for example a level of "0"). As is further illustrated in FIG. 1, the output circuits 107a, 107b may receive the same clock signal from the clock input 113 of the shift register 100 as the two latches 101a, 101b. It may thus be acquired that, when switching over the operating states of the latches 101a, 101b, also switching states of the output circuits 107a, 107b may be switched over simultaneously.

In other words, the clock input 113 of the shift register 100 may be coupled to the clock inputs 105a, 105b of the two latches 101a, 101b and to the clock inputs 117a, 117b of the output circuits 107a, 107b such that in response to a clock state change at the clock input 113 of the shift register 100, both the operating states of the latches 101a, 101b and also the switching states of the output circuits 107a, 107b change. For example, the output circuits 107a, 107b may provide the level depending on the signal values stored in the associated latch in a first switching state at their associated shift register output and provide the predetermined level in a second switching state.

The first output circuit 107a thus has its first switching state when the first latch 101a is in the non-transparent operating state and the second switching state when the first latch 101a is in the transparent operating state. This applies analogously for the second output circuit 107b and the second latch 101b.

Figure 2A:
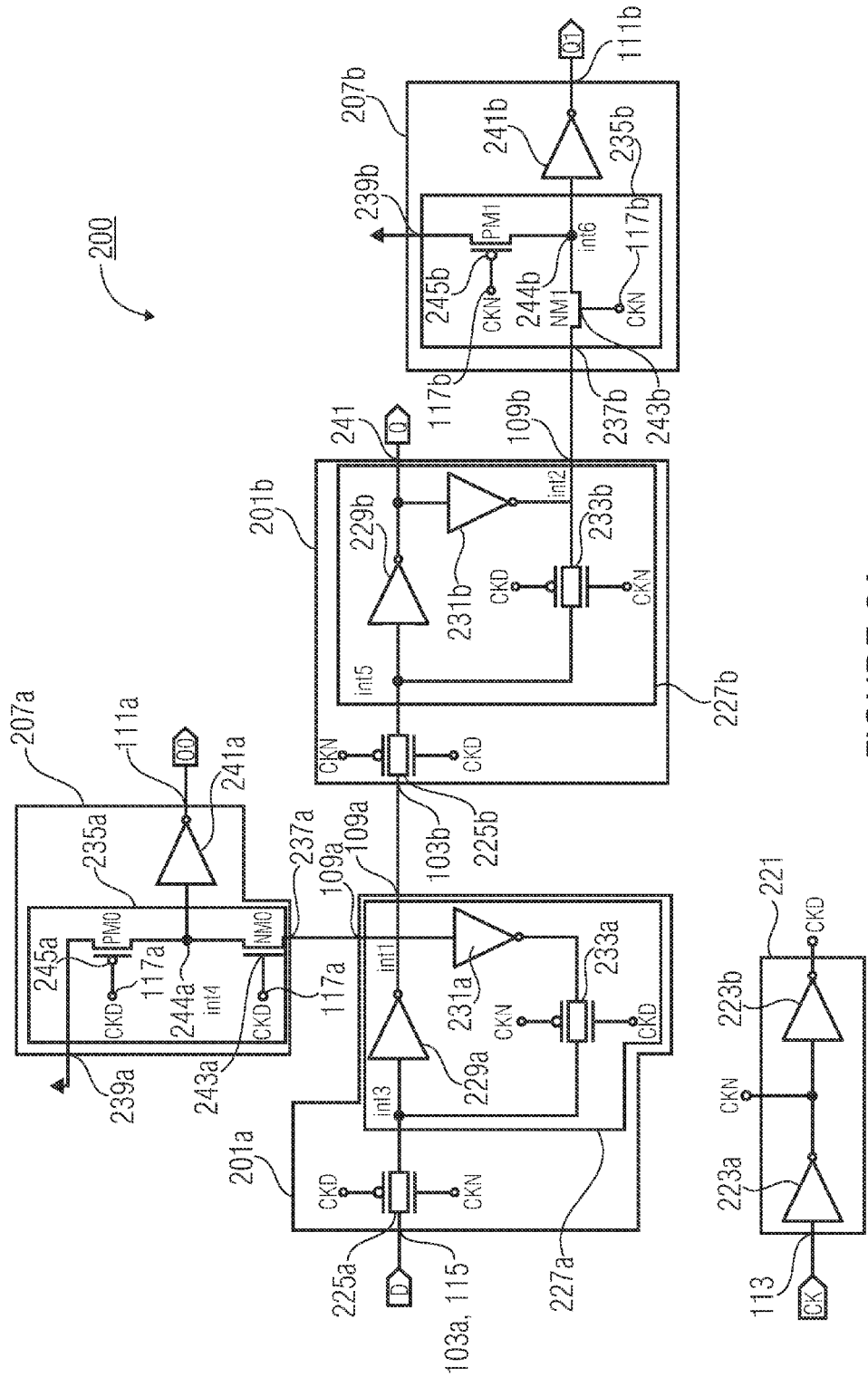
FIG. 2a is a schematical illustration of a circuit of a shift register according to a further embodiment.

FIG. 2a shows a schematical illustration of a circuit of a shift register 200 according to a further embodiment. The shift register 200 may be one possible implementation of the shift register 100 illustrated in FIG. 1. The shift register 200 comprises a first latch 201a and a second latch 201b. The two latches 201a, 201b may correspond to the two latches 101a, 101b of the shift register 100 with respect to their functionality. Further, the shift register 200 comprises a first output circuit 207a and a second output circuit 207b. The two output circuits 207a, 207b may correspond to the two output circuits 107a, 107b of the shift register 100 with respect to their functionality.

Further, the shift register 200 comprises an optional clock signal inverter and clock signal refresher or repeater 221.

The clock signal inverter and clock signal refresher 221 is implemented to invert and refresh a clock signal CK at the clock signal input 115 of the shift register 200 to provide the clock signal CK in an inverted version CKN and a non-inverted version CKD. The clock signal inverter and the clock signal refresher comprises two series-connected inverters 223a, 223b, wherein the inverted clock signal CKN is tapped at an output of a first inverter 223a of the series-connected inverters 223a, 223b and the non-inverted clock signal CKD is tapped at an output of a second inverter 223b of the two series-connected inverters 223a, 223b of the clock signal inverter and clock signal refresher 221. In the shift register 200, the clock signal CK thus exists in an inverted version CKN and a non-inverted version CKD.

The data input 103a of the first latch 201a simultaneously forms the data input 115 of the shift register 200. The first latch 201a comprises a first input switch 225a and a first feedback loop 227a. The first input switch 225a is connected between the first feedback loop 227a and the data input 103a of the first latch 201a. The first input switch 225a is implemented to couple the first feedback loop 227a to the data input 103a of the first latch 201a in the transparent operating state of the first latch 201a such that a signal state of a data signal D applied to the data input 103a is taken over into the first feedback loop 227a. The first feedback loop 227a is implemented to maintain the signal state taken over in the transparent operating state of the first latch 201a in the non-transparent operating state.

In the present application, a closed state of a switch is to indicate that the switch (or a switching path of the switch) is conductive (or low-impedance). An open or opened state of a switch is to indicate that the switch (or a switching path of the switch) is non-conductive (or high-impedance).

The first input switch 225a is thus closed when the first latch 201a is in the transparent operating state and is opened when the first latch 201a is in the non-transparent operating state.

Analogously to the first latch 201a, also the second latch 201b comprises a second input switch 225b and a second feedback loop 227b. Also with the second latch 201b, the second input switch 225b is connected between the data input 103b and the second feedback loop 227b. The two input switches 225a, 225b of the two latches 201a, 201b are controlled complementarily to each other, i.e. in one state in which the first input switch 225a is opened, the second input switch 225b is closed, and in a state in which the first input switch 225 is closed, the second input switch 225b is opened.

In the example illustrated in FIG. 2a, the first feedback loop 227a comprises a first inverter 229a and a series-connected (for example directly connected) second inverter 231a and a first feedback switch 233a series-connected to the second inverter 231a. An input of the first inverter 229a of the first feedback loop 227a simultaneously forms an input of the first feedback loop 227a and is coupled to the first input switch 225a. The feedback switch 233a of the feedback loop 227a is connected between the input of the first inverter 229a and an output of the second inverter 231a of the first feedback loop 227a.

Analogously to the first feedback loop 227a, also the second feedback loop 227b comprises two series-connected (for example directly connected) inverters 229b, 231b and a second feedback switch 233b series-connected thereto. The interconnection of the two inverters 229b, 231b and the second feedback switch 233b within the second latch 201b is identical to the interconnection of the inverters 229a, 231a and the first feedback switch 233a in the first feedback loop 227a of the first latch 201a.

The first input switch 225a of the first latch 201a and the first feedback switch 233a of the first latch 201a are switched complementarily, i.e. the first input switch 225a is opened when the first feedback switch 233a is closed and vice versa. The same applies accordingly to the second input switch 225b of the second latch 201b and the second feedback switch 233b of the second latch 201b.

The feedback switches 233a, 233b are thus opened in the transparent operating state of their latches 201a, 201b, and thus also the feedback loops 227a, 227b are opened. In the non-transparent operating state of their latches 201a, 201b, the feedback switches 233a, 233b are closed, and thus also the feedback loops 227a, 227b are closed and a signal value taken over into the respective latch is maintained in the feedback loops 227a, 227b.

Further, the first output circuit 207a comprises a first changeover switch 235a with a first input 237a and a second input 239a. The first changeover switch 235a is implemented to couple its first input 237a to the first shift register output 111a in a first switching state and to couple its second input 239a to the first shift register output 111a in a second switching state. The first input 237a of the first changeover switch 235a is coupled to the output 109a of the first latch 201a (for example directly connected). The level independent of the signal state existing in the first latch 201a (for example supply voltage level) is applied to the second input 239a of the first changeover switch 235a. In the embodiment illustrated in FIG. 2a, the signal state stored in the first feedback loop 227a is tapped at an output of the first inverter 229a of the feedback loop 227a (node int1). An output signal at the output 109a of the first latch 201a is thus inverted to the signal state originally applied to the first latch 201a. To balance this inversion and to be able to drive an output load, the first output circuit 207a may further comprise an inverter 241a which is connected between an output 244a of the first changeover switch 235a and the first shift register output 111a.

Further, the second output circuit 207b comprises a second changeover switch 235b with a first input 237b and a second input 239b. The second changeover switch 235b is implemented analogously to the first changeover switch 235a to couple its first input 237b to the second shift register output 111b in its first switching state and to couple its second input 239b to the second shift register output 111b in its second switching state. The first input 237b is here connected or switched such that a level at this input is independent of the signal state stored in the second feedback loop 227b. The second input is switched such that the level independent of the signal state applied in the second latch 201b is applied to the same (for example supply potential and for example equal to the level at the second input 239a of the first changeover switch 235a).

The interconnection of the second changeover switch 235b with the second latch 201b is different from the interconnection of the first changeover switch 235a with the first latch 201a because the first input 237b of the second changeover switch 235b is coupled to an output of the second inverter 231b of the second feedback loop 227b. A level applied to the first input 237b of the second changeover switch 235b is thus equal to a level of the signal state stored in the second feedback loop 227b of the second latch 201b.

The data signal D originally applied to the data input 115 of the shift register 200 is invertedly applied to the output of the second inverter 231b of the second feedback loop 227b (due to the triple inversion by the inverters 229a, 229b, 231b). This signal is corrected via an inverter 241b of the second output circuit 207b which is connected between an output 244b of the second changeover switch 235b and the second shift register output 111b. Further, the inverter 241b serves for driving an output load.

According to further embodiments, the inverters 241a, 241b may also be omitted, for example when the first input 237a of the first changeover switch 235a is coupled to the output of the second inverter 231a of the first feedback loop 227a and the first input 237b of the second changeover switch 235b is coupled to an output of the first inverter 229b of the second feedback loop 227b.

Clock inputs 117a, 117b of the changeover switches 235a, 235b are switched such that the second changeover switch 235b is in the second switching state (and couples its second input 239b to the second shift register output 111b) when the first changeover switch 235a is in the first switching state (and couples its first input 237a to the first shift register output 111a) and vice versa. This may be seen in FIG. 2a from the fact that the first changeover switch 235a receives the non-inverted version CKD of the clock signal CK while the second changeover switch 235b receives the inverted version CKN of the clock signal CK. In other words, the non-inverted version CKD of the clock signal CK is applied to a clock input 117a of the first changeover switch 235a and the inverted version CKN of the clock signal CK is applied to a clock input 117b of the second changeover switch 235b.

Due to the fact that the clock input 113 of the shift register 200 is coupled both to the clock inputs of the latches 201a, 201b and also to the clock inputs of the output circuits 207a, 207b, it may be acquired that, in response to a clock state change at the clock input 113 of the shift register 200, both the operating states of the latches 201a, 201b and also the switching states of the output circuits 207a, 207b change. In other words, the operating state changes of the latches 201a, 201b and the switching state changes of the output circuits 207a, 207b (or their changeover switches 235a, 235b) are based on the clock signal CK at the clock signal input 113 of the shift register 200. The shift register 200 may thus comprise one single clock signal input and one internal clock distribution. As both the output circuits 207a, 207b and also the latches 201a, 201b are based on the same clock signal CK, it may be acquired that the latches 201a, 201b switch synchronously to the output circuits 207a, 207b.

According to some embodiments, the changeover switches 235a, 235b may be clock-state controlled. Thus, for example, the first changeover switch 235a may be in the first switching state when a first level (for example a level of "1") is applied to its clock input and may be in the second switching state when a level (for example a level of "0") complementary to the first level is applied to its clock input. This applies analogously also for the second changeover switch 235b. It is to be noted, however, that, due to the inverted wiring of the two changeover switches 235a, 235b (visible from the fact that the first changeover switch 235a receives the non-inverted version CKD of the clock signal CK and the second changeover switch 235b receives the inverted version CKN of the clock signal CK), also the switching states of the two changeover switches 235a, 235b are complementary to each other. With regard to realization, the two changeover switches 235a, 235b may be implemented identically, i.e. that one level which leads to the first switching state of the first changeover switch 235a also leads to the first switching state with the second changeover switch 235b and that a level which leads to the second switching state with the first changeover switch 235a also leads to the second switching state with the second changeover switch 235b.

Further, the shift register 200 comprises a third shift register output 241. The third shift register output 241 serves for realizing a D flip-flop functionality of the shift register 200 illustrated in FIG. 2a. Thus, the data signal applied to the shift register output 115 is applied to the third shift register output 241 with a delay of one clock period of the clock signal CK. The third shift register output 241 may be used to couple several of the shift registers 200 with each other to realize a one-of-many shift register. Thus, the third shift register output 241 of a first shift register 200 may be coupled to a data input 115 of a following shift register 200 (for example directly connected) with a one-of-many shift register. In the embodiment illustrated in FIG. 2a, the third shift register output 241 is coupled to the output of the first inverter 229b of the second feedback loop 227b of the second latch 201b. The second latch 201b thus comprises two outputs, wherein the signal state taken over from the data input 103b of the second latch 201b is applied to one output in an inverted form (at the third shift register output 241) and to the other output (which is coupled to the input 237b of the second changeover switch 235b) in a non-inverted form.

In other words, the second latch 201b is coupled (for example directly connected) to the third shift register output 241 such that a level at the third shift register output 241 follows one at the data input 103a of the first latch 201a after a predetermined number of clock signal edges (for example two) of the clock signal CK at the clock signal input 113 of the shift register 200.

The level at the third shift register output 241 is thus only based on the signal state prevailing in the feedback loop 227b of the second latch 201b and is independent of the switching states of the output circuits 207a, 207b.

In the embodiment illustrated in FIG. 2a, the input switches 225a, 225b and the feedback switches 233a, 233b are realized by transistors connected in parallel, for example in the form of transmission gates 225a, 225b, 233a, 233b. Transmission gates of a latch (for example the transmission gate 225a and the transmission gate 233a of the first latch 201a) are here controlled invertedly.

According to further embodiments, the inputs switches 225a, 225bg and the feedback switches 233a, 233b may also be realized with other switches, like for example relays or one-transistor switches.

Further, the first changeover switch 235a of the first output circuit 207a is realized by a first switching transistor 243a and a second switching transistor 245a. The first switching transistor 243a is an n-channel field effect transistor and the second switching transistor 245a is a p-channel field effect transistor. A source-drain path of the first switching transistor 243a of the first changeover switch 235a is connected between the first input 237a and the output 244a of the first changeover switch 235a. A source-drain path of the second switching transistor 245a of the first changeover switch 235a is connected between the second input 239a and the output 244a of the first changeover switch 235a. At gate terminals of the two switching transistors 243a, 245a of the first changeover switch 235a, the clock signal CK is applied in the non-inverted version CKD.

Also the second changeover switch 235b is realized with a first switching transistor 243b which is an n-channel field effect transistor and with a second switching transistor 245b which is a p-channel field effect transistor. A source-drain path of the first switching transistor 243b is connected between the first input 237b and the output 244b of the second changeover switch 235b. A source-drain path of the second switching transistor 245b of the second changeover switch 235b is connected between the second input 239b and the output 244b of the second changeover switch 235b. At gate inputs of the two switching transistors 243b, 245b of the second changeover switch 235b, the clock signal CK is applied in the inverted version CKN and in this way it may be guaranteed that the first changeover switch 235a switches invertedly to the second changeover switch 235b.

According to further embodiments, the switching transistors 243a, 245a, 243b, 245b may also be replaced by transmission gates which correspond to the switches 225a, 225b, 233a, 233b.

Although in the embodiment illustrated in FIG. 2a the input switches 225a, 225b, the feedback switches 233a, 233b and the transistors 243a, 243b, 245a, 245b are implemented as field effect transistors, in further embodiments also other transistor types may be used, like for example bipolar transistors. Further, also a realization which is complementary to the realization illustrated in FIG. 2a is possible, for example utilizing an inverted clock control.

In the following, the functionality of the shift register 200 illustrated in FIG. 2a is to be explained with reference to a time-state diagram illustrated in FIG. 2b. In the time-state diagram illustrated in FIG. 2b, the following signals are plotted over time:

the non-inverted version CKD of the clock signal CK;
the inverted version CKN of the clock signal CK;
the level of the data signal D at the data input 115 of the shift register 200 and thus at the data input 103a of the first latch 201a;
the level at the output 109a of the first latch 201a (node int1);
the level at the output 109b of the second latch 201b (node int2);
the level at the first shift register output 111a (O0);
the level at the second shift register output 111b (O1);
the level at the third shift register output 241 (Q);

the level at the node between the first input switch 233a and the first inverter 229a of the first feedback loop 227a of the first latch 201b (node int3);

the level at the output 244a of the first changeover switch 235a (node int4);

the level at the node between the second feedback switch 233b and the first inverter 229a of the feedback loop 227b of the second latch 201b (node int5); and the level at the output 244b of the second changeover switch 235b of the second feedback circuit 207b (node int6).

Figure 2B:
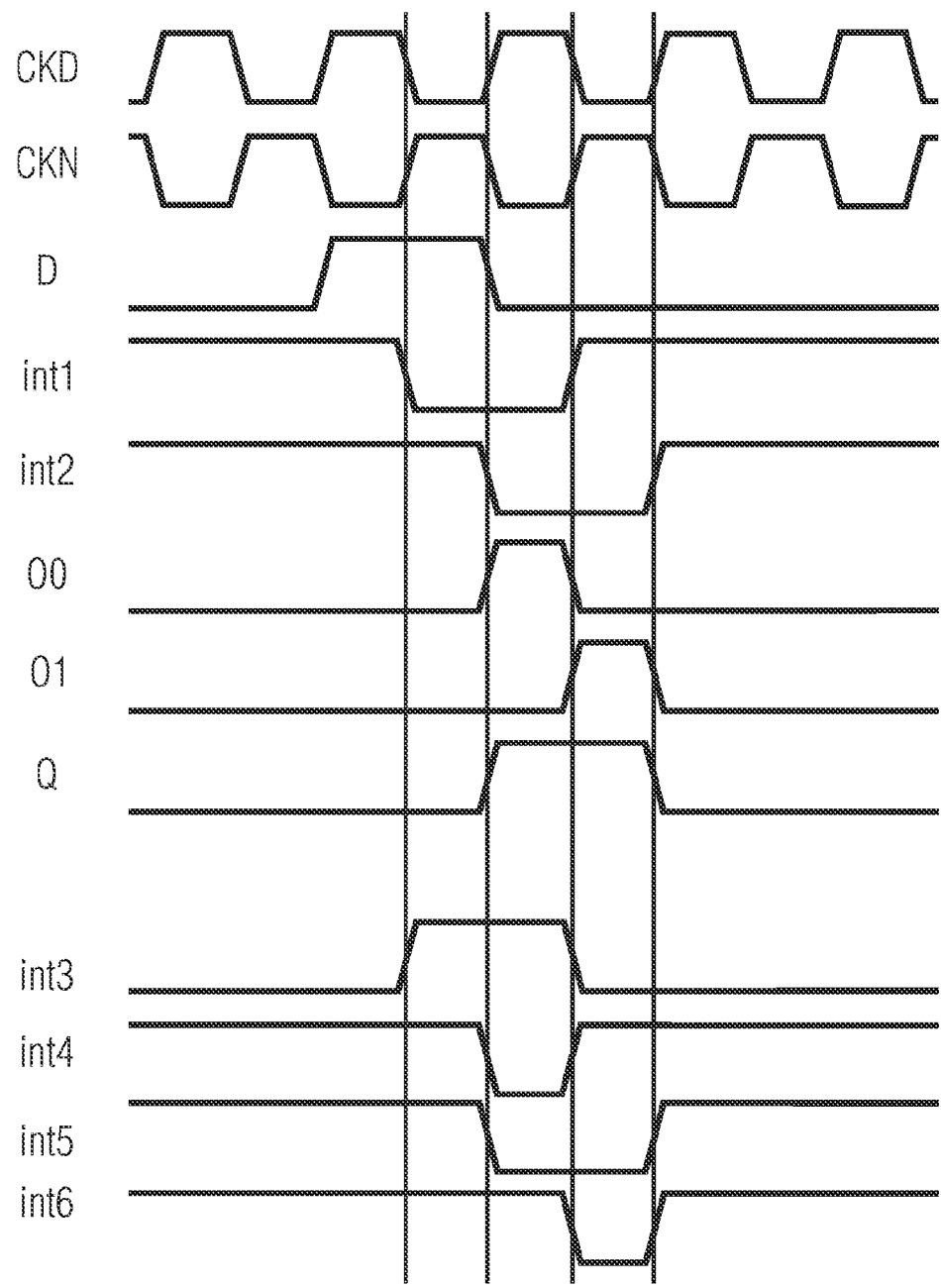

It may be seen in the diagram illustrated in FIG. 2b that the internal nodes int1 and int2 have overlapping values (due to a missing input inverter at the shift register 200 those signals are inverted with respect to the data signal D). The NMOS switches (the switching transistors 243a, 243b) and the PMOS switches (the switching transistors 245a, 245b) correct this overlap, so that while CKD has the level "1", O0 outputs a level "1", while at the level "0" of CKD O1 outputs a level "1".

O0 outputs a level "1" when the node int1 has a level of "0" and CKD has a level of "1". Then, the NMOS switch 243a at the node int1 is closed and passes on the value to the output inverter 241a.

This works very well if the node has the level of "0", i.e. when a "1" is stored in the latch 201a. If the node int1 has the level of "1", the NMOS switch 243a does not conduct up to the complete level of "1". The level at the inverter input of the inverter 241a is so high, however, that the inverter output (the first shift register output 111a) is correctly set to the level of "0". The PMOS switch 245a sets the inverter input of the output inverter 241a to a predetermined level (to the level "1" in the embodiment illustrated in FIG. 2a) with a level of "0" of CKD. The switches at the node int2 are controlled invertedly, so that "1" appears at the second shift register output 111b during a level of "0" of CKD.

It becomes clear from the diagram illustrated in FIG. 2b that the shift register 200 shifts on a level of "1" at its data input 115 with every clock edge of the clock signal CK and not with every second clock edge as is the case with a conventional D flip-flop. Further, the level of "1" taken over from the data input 115 is only applied to the two shift register outputs 111a, 111b for half a clock period of the clock signal CK. Further, also by the shift register 200 the typical clock state controlled D flip-flop functionality is provided at the third shift register output 241. This level provided may be used as an input in a subsequent shift register.

The shift register illustrated in FIG. 2a (or flip-flop 200) comprises only 28 transistors for the two shift register outputs 111a, 111b, i.e. 14 per shift register output. I.e., for a one-of-many shift register, as is interconnected in FIG. 3, for example, NH*14 transistors are necessitated (N is the number of latches or the number of shift register outputs controlled by the output circuits).

Figure 3:
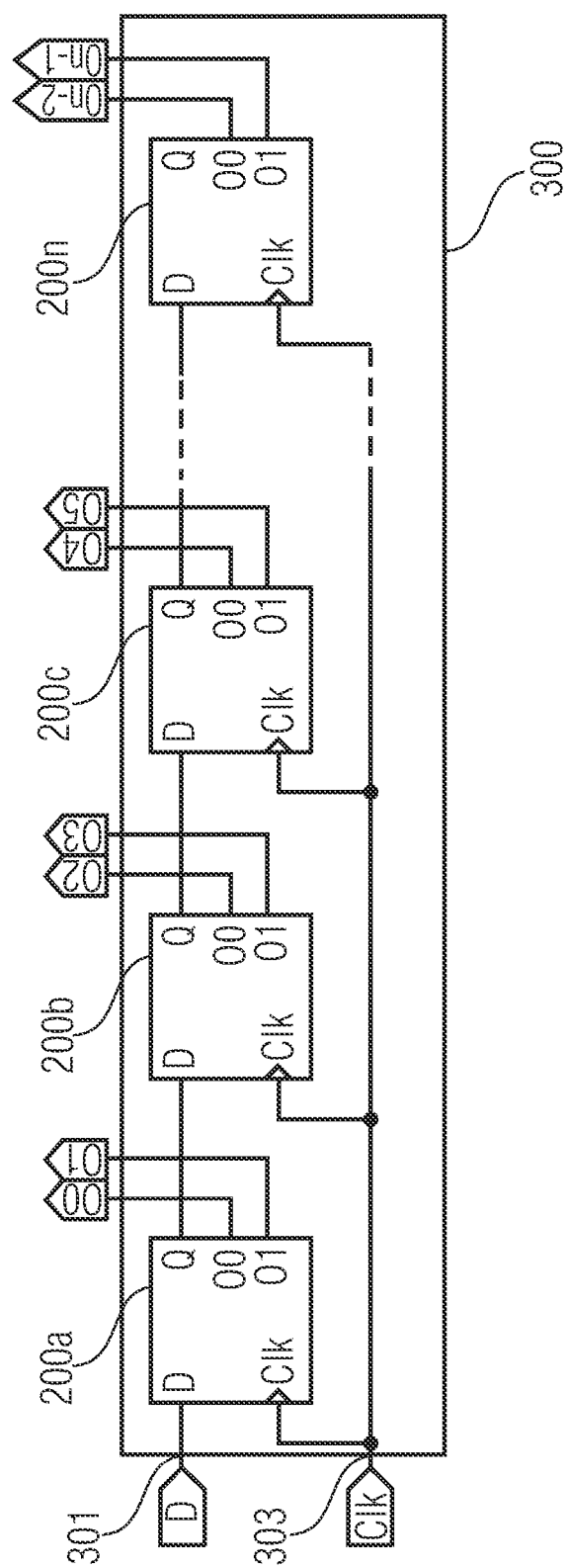
FIG. 3 is a block diagram of a one-of-many shift register according to one embodiment.
Figure 4:
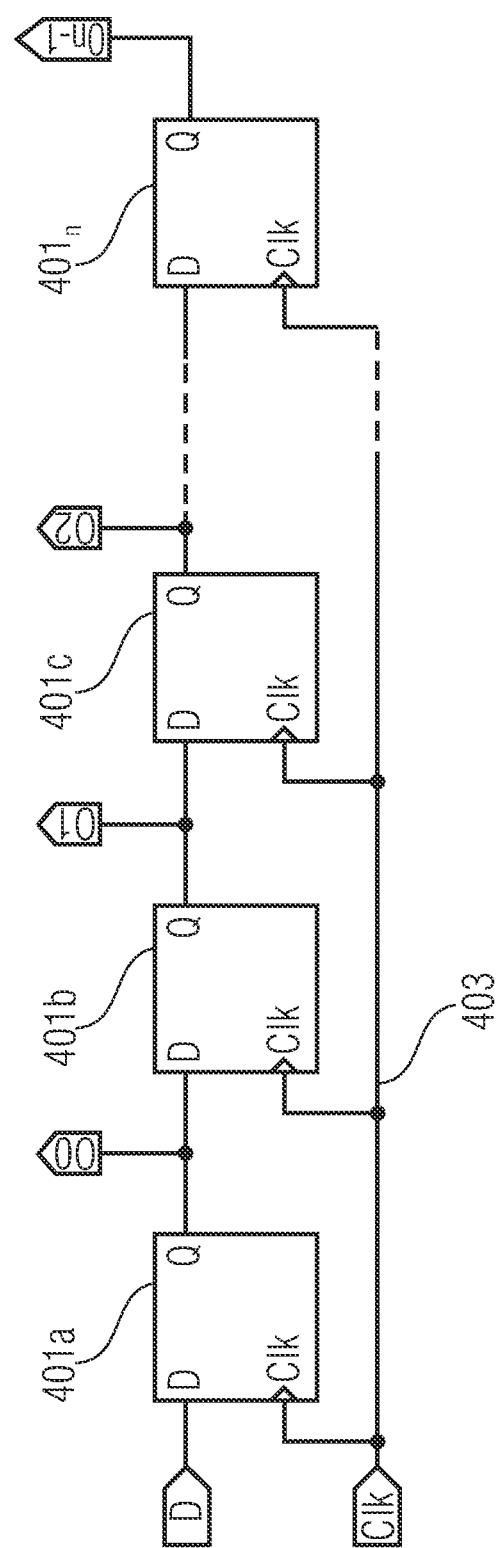
FIG. 4 is a block diagram of a conventional shift register.

FIG. 3 shows a block diagram of a one-of-many shift register 300 according to a further embodiment. The one-of-many shift register 300 comprises a data input 301 and a clock input 303. The one-of-many shift register 300 comprises a plurality of series-connected shift registers 200a to 200n. The shift registers 200a to 200n may, for example, be set up like the shift register 200 illustrated in FIG. 2a.

The shift registers 200a to 200n are coupled to the data input 301 and the clock input 303 such that a "1" applied to the data input 301 is shifted through the shift registers 200a to 200n such that with a falling (or rising) clock edge at the clock input 303 the "1" is shifted on from a first shift register output of a shift register to a second shift register output of the same shift register and that with a rising (or falling) clock edge the "1" is shifted on from the second shift register output of the shift register to a first shift register output of a subsequent shift register. In other words, with a first clock edge direction, the "1" is shifted on internally in the shift registers, while with a second clock edge direction (which is complementary to the first clock edge direction) the "1" is shifted on from one shift register into the next shift register.

Thus, for example, utilizing the implementation of the shift registers, as illustrated in FIG. 2a, a "1" at the data input 301 of the one-of-many shift register 300 which is stored in a first shift register 200a of the plurality of shift registers 200a to 200n, is shifted on with a falling clock edge from the first shift register output O0 of the first shift register 200a to the second shift register output O1 of the first shift register 200a and is shifted on with a subsequent rising clock edge from the first shift register 200a to a second shift register 200b (which is downstream from the first shift register 200a), so that the "1" is then applied to the first shift register output O2 of the second shift register 200b.

The shift registers 200a to 200n may be directly connected, i.e. a third shift register output of the first shift register 200a may be directly connected to a data input of the second shift register 200b (for example without additional amplifiers or inverters or switches). This also applies to the series connection of the further shift registers 200c to 200n.

By the direct connection of the shift registers 200a to 200n to each other, both the input inverter 501 illustrated in FIG. 1 and also the output inverter 505 may be omitted with the shift registers 200a to 200n, as the flip-flops or shift registers 200a to 200n are directly connected to each other (without logics and long lines) and therefore a signal refreshment is not necessary. By this elimination of the input inverter and the output inverter with the shift registers 200a and 200n, additionally the number of transistors may be reduced which are necessitated for the implementation of the one-of-many shift register 300. A further reduction of the necessitated transistors is, as was already explained above, acquired by utilizing both latch outputs for the shift register outputs.

The one-of-many shift register illustrated in FIG. 3 thus manages with N*14 transistors (wherein N is the number of outputs of the shift register 300 or double the number of the shift registers 200a to 200n).

By the reduced number of transistors, the space requirement for the complete one-of-many shift register 300 and for each individual shift register 200a to 200n is substantially lower.

Embodiments of the present invention function for (virtually) all clock frequencies; also for very low ones or when the clock is stopped for a certain time.

Additionally, the output is shifted on with every clock edge, so that the clock frequency may be halved, which reduced interferences of other circuit parts on the same integrated circuitry.

According to further embodiments, for low output loads also the output inverters 241a, 241b illustrated in FIG. 2a may be omitted, whereby a further reduction of the number of necessitated transistors results.

Further, according to embodiments, at any position an inverter may be replaced by a cascading of inverters. The cascading of the inverters may also be done across the switches.

According to further embodiments, the shift register 200 illustrated in FIG. 2a may additionally comprise an input inverter at the data input 115 and an output inverter at the third shift register output 241.

According to further embodiments, also for the inversion of the signals, tapping the output switch inputs (of the output circuits) before the respective inverter or after the respective next inverter of the feedback chain (the feedback loops 227a, 227b) may be possible.

According to further embodiments, by inserting additional inverters some intermediate signals may be inverted. By this, for example the polarity of the one-transistor switches 243a, 245a, 243b, 245b (instead of NMOS→PMOS and vice versa) and the control level (instead of CKN→CKD and vice versa) may be reversed.

According to further embodiments, the third shift register output 241 may be shifted by additional inverts in the path, for example before the previous or the next inverter.

Embodiments may, for example, be applied in image sensors or in multiplexers in general.

Embodiments thus provide a more space-efficient D flip-flop for a one-of-many shift register.

Figure 5:
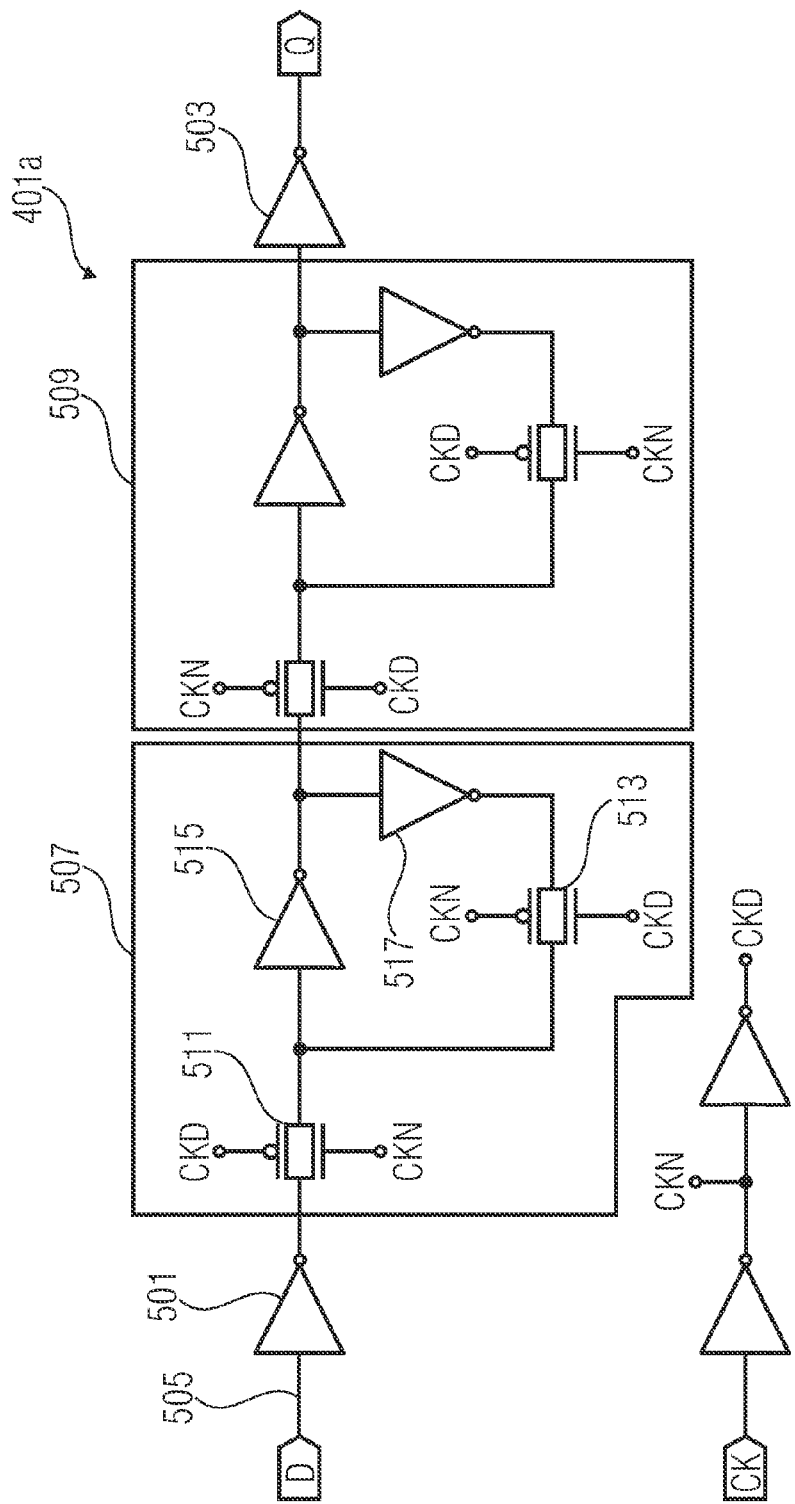
FIG. 5 is a schematical illustration of a circuit of a D flip-flop.

With conventional shift registers, a D flip-flop is necessitated for each output. As conventional D flip-flop implementations (as illustrated in FIG. 5, for example) have 24 transistors, 24 transistors are also needed per shift register. Embodiments enable a reduction of the necessitated transistors per shift register output (for example on 14 transistors per shift register output, as illustrated in FIG. 2a).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A one-of-many selection circuit comprising a one-of-many shift register comprising a data input and a clock input, the one-of-many shift register comprising:
    a plurality of series-connected shift registers, wherein each shift register comprises:
    a first latch which is implemented to take over a signal state applied to its data input in a transparent operating state and to maintain the taken-over signal state in a non-transparent operating state;
    a second latch which is implemented to take over a signal state applied to its data input in a transparent operating state and to maintain the taken-over signal state in a non-transparent operating state;
    wherein the first latch and the second latch are series-connected;
    wherein clock inputs of the latches are switched such that the second latch is in the transparent operating state when the first latch is in the non-transparent operating state and vice versa;
    a first output circuit which is implemented to provide a predetermined level independent of the signal state existing in the first latch at a first shift register output of the shift register in the transparent operating state of the first latch and to provide a level depending on the signal state stored in the first latch in the non-transparent operating state of the first latch; and
    a second output circuit which is implemented to provide a predetermined level independent of the signal state existing in the second latch at a second shift register output of the shift register in the transparent operating state of the second latch and to provide a level depending on the signal state stored in the second latch in the non-transparent operating state of the second latch;
    wherein the shift registers are coupled to the data input and the clock input such that a "1" applied to the data input is shifted through the shift registers such that with a falling clock edge at the clock input the "1" is shifted on from a first shift register output of a first shift register of the plurality of shift registers to a second shift register output of the same shift register and that with a rising clock edge the "1" is shifted on from the second shift register output of the first shift register to a first shift register output of a subsequent shift register;
    or that with a rising clock edge at the clock input the "1" is shifted on from a first shift register output of a first shift register of the plurality of shift registers to a second shift register output of the same shift register and that with a falling clock edge the "1" is shifted on from the second shift register output of the first shift register to a first shift register output of a subsequent shift register.

2. The one-of-many selection circuit according to claim 1, wherein the clock inputs of the two latches are switched invertedly such that, when a first level is applied to the clock input of the first latch, a level complementary to the first level is applied to the clock input of the second latch.

3. The one-of-many selection circuit according to claim 1, wherein clock inputs of the output circuits are switched invertedly such that, when a first level is applied to a clock input of the first output circuit, a level complementary to the first level is applied to a clock input of the second output circuit.

4. The one-of-many selection circuit according to claim 1, wherein a clock input of the shift registers is coupled to the clock inputs of the latches and to the clock inputs of the output circuits, such that in response to a clock state change at the clock input of the shift registers both the operating states of the latches and also the switching states of the output circuits change.

5. The one-of-many selection circuit according to claim 1, wherein the first output circuit comprises a first changeover switch with a first input and a second input;
    wherein the first changeover switch is implemented, in its first switching state, to couple its first input to the first shift register output and, in its second switching state, to couple its second input to the first shift register output;
    wherein the first changeover switch is switched such that a level applied to its first input is based on the signal state existing in the first latch and that a level applied to its second input is independent of the signal state existing in the first latch;
    wherein the second output circuit comprises a second changeover switch with a first input and a second input;
    wherein the second changeover switch is implemented, in its first switching state, to couple its first input to the second shift register output and, in its second switching state, to couple its second input to the second shift register output; and
    wherein the second changeover switch is switched such that a level applied to its first input is based on the signal state existing in the second latch and that a level applied to its second input is independent of the signal state existing in the second latch.

6. The one-of-many selection circuit according to claim 5, wherein clock inputs of the changeover switches are switched such that the second changeover switch is in its second switching state when the first changeover switch is in its first switching state and vice versa.

7. The one-of-many selection circuit according to claim 5, wherein the changeover switches are clock state controlled such that the first changeover switch is in its first switching state when a first level is applied to its clock input and is in its second switching state when a level complementary to the first level is applied to the clock input of the first changeover switch and such that the second changeover switch is in its first switching state when a second level is applied to its clock input and is in its second switching state when a level complementary to the second level is applied to the clock input of the second changeover switch.

8. The one-of-many selection circuit according to claim 1, wherein the second latch is coupled to a third shift register output such that a level at the third shift register output follows a level at the data input of the first latch after a predetermined number of clock signal edges at a clock signal input of the shift register.

9. The one-of-many selection circuit according to claim 1, wherein the first latch comprises a first input switch and a first feedback switch switched complementarily with respect to each other;
wherein the first input switch is conductive in the transparent operating state of the first latch to take over the signal state applied to the data input of the first latch and is not conductive in the non-transparent operating state;
wherein the first feedback switch is conductive in the non-transparent operating state of the first latch to maintain the signal state taken over from the data input of the first latch in the first latch;
wherein the second latch comprises a second input switch and a second feedback switch which is switched complementarily to each other;
wherein the first input switch is conductive in the transparent operating state of the second latch to take over the signal state applied to the data input of the second latch and is not conductive in the non-transparent operating state of the second latch;
wherein the second feedback switch is conductive in the non-transparent operating state of the second latch to maintain the signal state taken over from the data input of the second latch in the second latch.

10. The one-of-many selection circuit according to claim 9, wherein the shift registers are implemented such that the first input switch of the first latch is switched complementarily to the second input switch of the second latch and that the first feedback switch of the first latch is switched complementarily to the second feedback switch of the second latch.

11. The one-of-many selection circuit according to claim 9, wherein the first latch comprises a first feedback loop;
wherein the first feedback loop is connected behind the first input switch and the first feedback switch is implemented to open and close the first feedback loop to take over the signal state applied to the data input of the first latch into the first feedback loop in the transparent operating state of the first latch with an opened first feedback loop and to maintain the taken-over signal state in the first feedback loop in the non-transparent operating state of the first latch with a closed first feedback loop;
wherein the second latch comprises a second feedback loop;
wherein the second feedback loop is connected behind the second input switch and the second feedback switch is implemented to open and close the second feedback loop to take over the signal state applied to the data input of the second latch into the second feedback loop in the transparent operating state of the second latch with an opened second feedback loop and to maintain the taken-over signal state in the second feedback loop in the non-transparent operating state of the second latch with a closed second feedback loop.

12. The one-of-many selection circuit according to claim 11,
wherein the first feedback loop comprises at least two series-connected inverters;
wherein the first input switch is coupled to an input of a first inverter of the at least two series-connected inverters of the first feedback loop;
wherein the first feedback switch is connected between an output of a last inverter of the at least two series-connected inverters of the first feedback loop and the input of the first inverter of the first feedback loop;
wherein the second feedback loop of the second latch comprises at least two series-connected inverters;
wherein the second input switch is coupled to an input of a first inverter of the at least two series-connected inverters of the second feedback loop; and
wherein the second feedback switch is connected between an output of a last inverter of the at least two series-connected inverters of the second feedback loop and the input of the first inverter of the second feedback loop.

13. The one-of-many selection circuit according to claim 12,
wherein the first output circuit is coupled to an output of the first inverter of the first feedback loop to provide the level provided at the first shift register output in the non-transparent operating state of the first latch depending on a level at the output of the first inverter of the first feedback loop.

14. The one-of-many selection circuit according to claim 12,
wherein the second output circuit is coupled to the output of the second inverter of the second feedback loop to provide the level provided at the second shift register output in the non-transparent operating state of the second latch depending on a level at the output of the second inverter of the second feedback loop.

15. The one-of-many selection circuit according to claim 12,
wherein a third shift register output is coupled to an output of the first inverter of the second feedback loop such that a level at the third shift register output is based on a level at the output of the first inverter of the second feedback loop and is independent of switching states of the two output circuits.

16. The one-of-many selection circuit according to claim 1, wherein the first latch is directly connected to the second latch such that a level applied to an output of the first latch is equal to a level applied to a data input of the second latch.

17. The one-of-many selection circuit according to claim 1, wherein a first input of the first output circuit is directly connected to an output of the first latch; and
wherein a first input of the second output circuit is directly connected to an output of the second latch.

18. An image sensor comprising a one-of-many selection circuit according to claim 1.

19. A multiplexer comprising a one-of-many selection circuit according to claim 1.

* * * * *